United States Patent

Isoda et al.

[11] Patent Number: 5,826,330
[45] Date of Patent: Oct. 27, 1998

[54] METHOD OF MANUFACTURING MULTILAYER PRINTED WIRING BOARD

[75] Inventors: Satoshi Isoda; Yasuhiro Iwasaki; Kenshirou Fukuzato; Tsutomu Zama; Kōichi Noguchi; Toshiro Okamura; Hiroyoshi Yokoyama; Youiti Matuda, all of Tochigi, Japan

[73] Assignee: Hitachi AIC Inc., Tokyo, Japan

[21] Appl. No.: 768,426

[22] Filed: Dec. 18, 1996

[30] Foreign Application Priority Data

Dec. 28, 1995 [JP] Japan .................................. 7-343761
Jan. 22, 1996 [JP] Japan .................................. 8-008260
Mar. 21, 1996 [JP] Japan .................................. 8-064197
Aug. 23, 1996 [JP] Japan .................................. 8-222281

[51] Int. Cl.⁶ ................................................ H01K 3/10
[52] U.S. Cl. .................... 29/852; 219/121.7; 219/121.71; 219/121.74; 427/97
[58] Field of Search .......................... 29/852; 219/121.7, 219/121.71, 121.74, 121.76; 427/97

[56] References Cited

U.S. PATENT DOCUMENTS 3,770,529 11/1973 Anderson .
4,644,130 2/1987 Bachmann .
4,789,770 12/1988 Kasner et al. .
5,087,396 2/1992 Zablotny et al. .
5,194,713 3/1993 Eqitto et al. .
5,227,013 7/1993 Kumar .
5,293,025 3/1994 Wang .

FOREIGN PATENT DOCUMENTS 2548258  5/1977  Germany .
4125018  1/1993  Germany .
SHO
42-40710  5/1972  Japan .
HEI 2-500891  9/1989  Japan .............................. B23K 26/00
HEI 4-51314  6/1993  Japan .............................. H05K 3/46
HEI 6-13488  1/1994  Japan .............................. H01L 23/12
HEI 4-273909  5/1994  Japan .............................. H05K 1/11
HEI 8-243771  9/1996  Japan .............................. B23K 26/00
HEI 8-323488  12/1996  Japan .............................. B23K 26/00

OTHER PUBLICATIONS

Printed Circuits Technical Handbook, chap. 4.10, Other Organic Insulation Substrate, section 4.10.1 Multilayer Board for Active Method Printed Circuits, p. 363, lines 7–9 (in Japanese).

*Primary Examiner*—Carl Arbes
*Attorney, Agent, or Firm*—Blakely Sokoloff Taylor & Zafman

[57] ABSTRACT

In a method of manufacturing a multilayer printed wiring board including an internal wiring circuit formed on a board, an insulating resin layer formed on the internal wiring circuit, a blind hole formed in the insulating resin layer and communicating with the internal wiring circuit, and a conductive portion formed on an inner wall of the blind hole and connected to the internal wiring circuit, the blind hole is formed by using a short-pulse $CO_2$ laser.

8 Claims, 9 Drawing Sheets

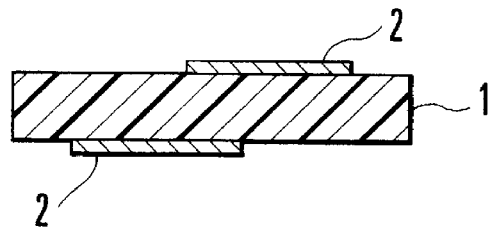
F I G. 1 A
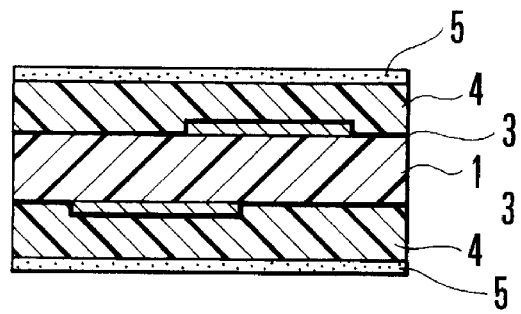
F I G. 1 B
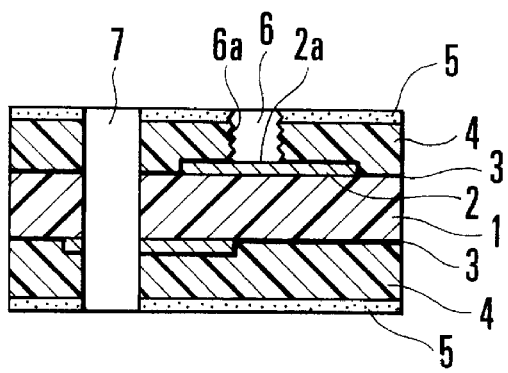
F I G. 1 C
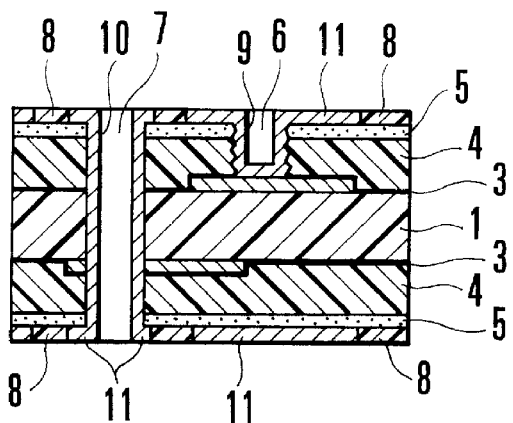
F I G. 1 D

METHOD OF MANUFACTURING MULTILAYER PRINTED WIRING BOARD

BACKGROUND OF THE INVENTION

The present invention relates to a method of manufacturing a multilayer printed wiring board and, more particularly, to a method of manufacturing a multilayer printed wiring board having a connection blind hole for connecting layers.

Multilayer printed wiring boards have recently been used in various fields to manufacture compact apparatuses by increasing the integration degree of parts. In general, in such a multilayer printed wiring board, the interconnections on the respective layers of the multilayer structure are connected to each other by plating a through hole.

FIGS. 9A to 9D and 10 show conventional methods of manufacturing a multilayer printed wiring board.

The first conventional method will be described first with reference to FIGS. 9A to 9D. As shown in FIG. 9A, a hole 63 is formed in an upper copper-clad laminate 61 (of upper and lower copper-clad laminates 61 and 62) by using a drill, and conductive portions 64 and a conductive connecting portion 65 that defines a connection blind hole are formed by electroplating, thereby forming double-sided plates 66.

Subsequently, as shown in FIG. 9B, internal wiring circuits 67 are respectively formed, by etching, on one of the two sides of one double-sided plate 66 and one of the two sides of the other double-sided plate 66 which oppose each other.

As shown in FIG. 9C, a glass-cloth resin-impregnated fabric 68 serving as a prepreg is sandwiched between the internal wiring circuits 67 of the double-sided plates 66 and subjected to thermocompression bonding by heating/pressing.

A through hole 69 is then formed in the resultant structure by using the drill, and conductive portions 70 and a conductive connecting portion 71 that defines a through hole are formed by electroplating.

Furthermore, as shown in FIG. 9D, external wiring circuits 72 are formed by etching. As a result, a multilayer printed wiring board having a connection blind hole for connecting the layers is formed.

The second conventional method will be described next with reference to FIG. 10. In this method, primer layers 83, insulating resin layers 84, and adhesive layers 85 are formed on the two sides of a copper-clad laminate 81 having internal wiring circuits 82 formed on its upper and lower surfaces. After external wiring circuits 91 are formed on the resultant structure through plating resist layers 88, a blind hole 86 is formed by using a drill. In this hole, a conductive connecting portion 89 that defines a connection blind hole is formed by electroplating.

In the first conventional method shown in FIGS. 9A to 9D, the double-sided plates 66 are bonded to each other. Owing to this structure, a plating process is performed once for each of the copper-clad laminates 61 and 62, i.e., two times, and is also performed once after the double-sided plates are bonded to each other and the through hole 69 is formed. That is, a plating process must be performed a total of three times. For this reason, the manufacturing cost is high.

In the second conventional method shown in FIG. 10, since the depth of a hole formed with the drill must be controlled, some additional time is required to form a hole. That is, this method is not suitable for mass production.

In addition, electrical conduction may become unreliable due to slight manufacturing errors.

SUMMARY OF THE INVENTION

It is an object of the present invention to ensure adhesion of a metal portion formed on the inner wall of a blind hole to the inner wall of the connection blind hole when an internal wiring circuit is connected to an upper portion of a board through the connection blind hole formed above the internal wiring circuit.

It is another object of the present invention to attain a reduction in manufacturing cost and an improvement in productivity by decreasing the number of manufacturing steps.

It is still another object of the present invention to allow electron parts to be mounted at a high density by decreasing the minimum hole diameter of a through hole which can be formed.

In order to achieve the above objects, according to the present invention, there is provided a method of manufacturing a multilayer printed wiring board including an internal wiring circuit formed on a board, an insulating resin layer formed on the internal wiring circuit, a blind hole formed in the insulating resin layer and communicating with the internal wiring circuit, and a conductive portion formed on an inner wall of the blind hole and connected to the internal wiring circuit, comprising forming the blind hole by using a short-pulse $CO_2$ laser.

BRIEF DESCRIPTION OF THE DRAWINGS

FIGS. 1A to 1D are sectional views for explaining the steps in a method of manufacturing a multilayer printed wiring board according to the present invention;

DESCRIPTION OF THE PREFERRED EMBODIMENTS

Figure 2A:
FIGS. 2A and 2B are photographs of the inner wall of a blind hole which are taken with 300× and 2,000× microscopes when the blind hole is formed in a multilayer printed wiring board according to the present invention by using a short-pulse $CO_2$ laser beam.

Referring to FIG. 1A, reference numeral 1 denotes a glass epoxy copper-clad laminate 1 containing a plating catalyst. First of all, internal wiring circuits 2 are formed on the upper and lower surfaces of the copper-clad laminate 1 by etching.

Subsequently, as shown in FIG. 1B, insulating resin layers 4 made of an epoxy resin material as a main component consisting of an insulating resin which contains a plating catalyst but does not contain any glass cloth are formed on the upper and lower surfaces of the copper-clad laminate 1 through primer layers 3. Adhesive layers 5 are formed on the surfaces of the insulating resin layers 4. With the primer layers 3, the adhesive properties between the insulating resin layers 4 and the copper-clad laminate 1 improve.

As shown in FIG. 1C, when a short-pulse $CO_2$ laser beam which can cut the insulating resin layer 4 within a short period of time at high energy without carbonizing it is irradiated onto the internal wiring circuit 2 from above one of the insulating resin layers 4, since the laser beam is reflected by the metal and does not pass through the internal wiring circuit 2, a blind hole 6 is formed in only the adhesive layer 5 and the insulating resin layer 4 by the laser beam. In addition, a through hole 7 is formed in the resultant structure by using a drill.

As shown in FIG. 1D, a desmear process and seeder process are performed for the inner wall surface of the through hole 7 which correspond to the insulating resin layers 4 for 18 minutes by using 950 g/l of anhydrous chromic acid of 38° C. Thereafter, resist layers 8 of a reverse pattern to that of external wiring circuits 11 are formed. The resultant structure is then roughened for five minutes by using a roughening solution of 36° C. which consists of three components, i.e., 10 g/l of NaF, 15 g/l of $CrO_3$, and 400 ml/l of $H_2SO_4$.

Subsequently, a conductive connecting portion 9 is precipitated on the wall surface of the blind hole 6 by electroless copper plating to form a connection blind hole. A conductive connecting portion 10 is also precipitated on the wall surface of the through hole 7 to form a connection through hole. The external wiring circuits 11 electrically connected to the conductive connecting portions 9 and 10 are formed on the resultant structure.

Figure 2B:
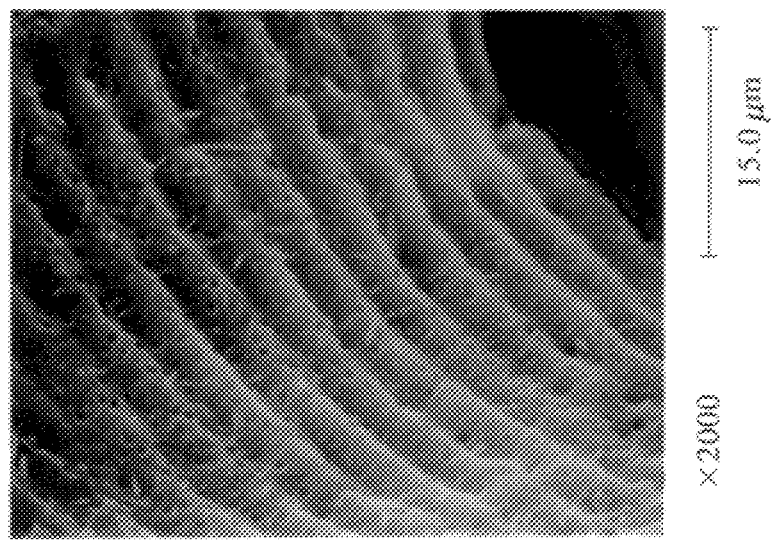

Since the blind hole 6 is formed by a short-pulse $CO_2$ laser beam, a plurality of ring-like projections are formed on a wall surface 6a of the blind hole 6 in the vertical direction, as shown in FIGS. 2A and 2B.

In general, when the blind hole 6 is formed by a laser beam, a resin residue of the insulating resin layer 4 tends to stay on a surface 2a of the internal wiring circuit 2. For this reason, the adhesion strength between the conductive connecting portion 9 and the internal wiring circuit 2 is low. When, therefore, an external shock is exerted on this structure, a stress is generated between the conductive connecting portion 9 and the internal wiring circuit 2. As a result, the conductive connecting portion 9 peels off from the internal wiring circuit 2 to cause a conduction failure.

As described above, when ring-like projections are formed on the wall surface 6a of the blind hole 6, the adhesion properties between the conductive connecting portion 9 and the wall surface 6a of the blind hole 6 improve. As a result, the stress generated between the conductive connecting portion 9 and the internal wiring circuit 2 is reduced, thereby preventing a conduction failure which is caused when the internal wiring circuit 2 peels off from the conductive connecting portion 9.

In this case, the adhesion strength between the conductive connecting portion 9 and the wall surface 6a of the blind hole 6 is closely associated with the intervals between the projections on the wall surface 6a. It was found from an experiment result that projections were preferably formed at intervals of 4 to 15 μm to improve the adhesion properties.

On the other hand, the intervals between these projections are closely associated with the oscillation wavelength of a short-pulse $CO_2$ laser. It is known that projections are formed at intervals of ½ the oscillation wavelength.

Therefore, in order to improve the adhesion properties by forming projections at intervals of 4 to 15 μm, a short-pulse $CO_2$ laser having an oscillation wavelength within the range of 8 to 30 μm is preferably used. In this embodiment, a laser having an oscillation wavelength of 10.6 μm is used to form projections at intervals of about 5.3 μm.

Figure 10:
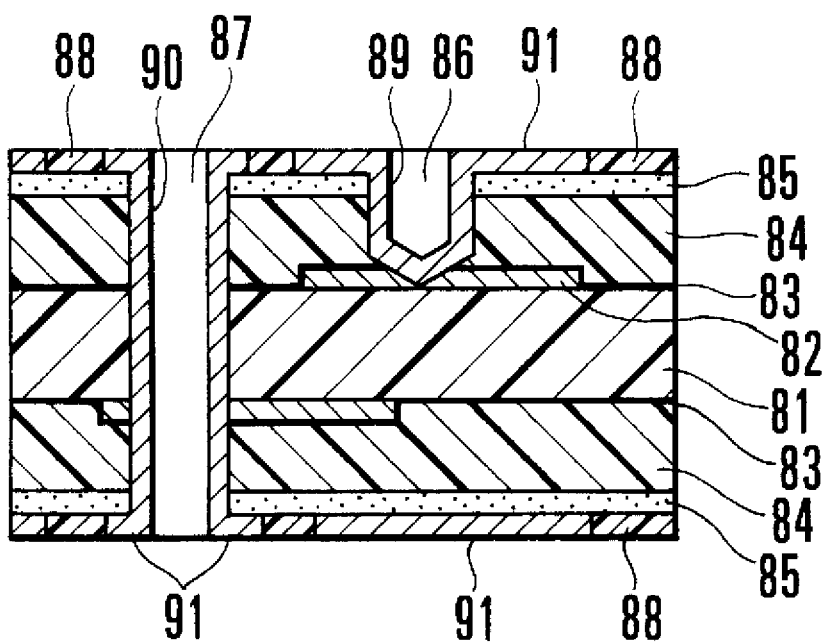
FIG. 10 is an enlarged sectional view showing the main part of a conventional multilayer printed wiring board.

Table 1 shows the comparison result obtained by exerting thermal shocks on the connection blind hole in the present invention and the connection blind hole in the prior art described with reference to FIG. 10.

As is apparent from this table, the connection blind hole in the present invention, i.e., the blind hole 6 having the roughened wall surface 6a on which the projects are formed, is superior in reliability to the connection blind hole in the prior art.

Note that this table is obtained by 1,000 cycles of a thermal shock test based on the U.S. military standard "MIL-STD-202E, 107D". This standard is based on the quality standard "MIL-P-55110C".

Each sample is formed according to the double-sided printed board composite test pattern based on JIS C5012. More specifically, a multilayer plate having first and second layers respectively constituted by samples D is formed such that the distance between the first and second layers is 80 μm, and the plating thickness is 30 μm.

One thousand samples are used. A sample which exceeds the initial resistance of the connection blind hole by 10% is counted as an "NG" sample.

TABLE 1

| Sample | Intervals between Projections on Wall Surface of Connection Blind Hole | Number of NG Samples |
| --- | --- | --- |
| Present Invention | present: 5.3 μm | 0 |
| Prior Art: FIG. 10 | absent | 7 |

According to the present invention, since there is no glass-cloth resin-impregnated fabric, serving as a prepreg by which a laser beam is irregularly reflected, between the internal wiring circuit 2 and the external wiring circuit 11, unlike the prior art, the blind hole 6 can be properly formed by a laser beam. Projections are therefore formed to improve the adhesion properties between the conductive connecting portion 9 and the wall surface 6a of the blind hole 6.

In addition, since the present invention uses the method of simultaneously forming the blind hole 6 and the through hole 7 after the insulating resin layer 4 is stacked on the copper-clad laminate 1, the conductive connecting portions 9 and 10 and the external wiring circuits 11 can be formed by performing electroless plating once. A reduction in cost can therefore be attained as compared with the first conventional method described with reference to FIGS. 9A to 9D, in which plating is performed three times.

In addition, since the insulating resin layer 4 contains a plating catalyst, and the conductive connecting portions 9 and 10 and the external wiring circuit 11 are formed by electroless plating, the dipping step in a plating solution can be omitted, and a reduction in cost can be attained as compared with the method of forming these components by electroplating. Furthermore, since the insulating resin layer 4 contains a plating catalyst, it suffices to perform a seeder process once, which is performed three times in the prior art. Consequently, the number of steps can be greatly decreased, and the adhesion strength of the external wiring circuits 11 increases. Note that a plating catalyst containing 3 to 10% palladium is used, and a seeder process is performed by dipping in a tin-palladium colloid catalyst.

Since no glass-cloth resin-impregnated fabric is used, a short-pulse $CO_2$ laser beam having low energy can be used to form the blind hole 6. For this reason, the smear residues on the wall surface 6a and upper edge of the blind hole 6 can be reduced.

It is impossible to realize a minimum effective hole diameter of 100 μm or less in the prior art. In the present invention, however, a minimum effective hole diameter of 40 μm can be realized by using a short-pulse $CO_2$ laser beam, thereby realizing a high-density wiring board.

In this embodiment, when the conductive portion is formed on the inner wall of the blind hole 6, the external wiring circuits 11 to be connected to the conductive connecting portion 9 are simultaneously formed. However, the terminals of electronic parts and the like may be connected to the conductive connecting portion 9 without forming the external wiring circuits 11.

Figure 3:
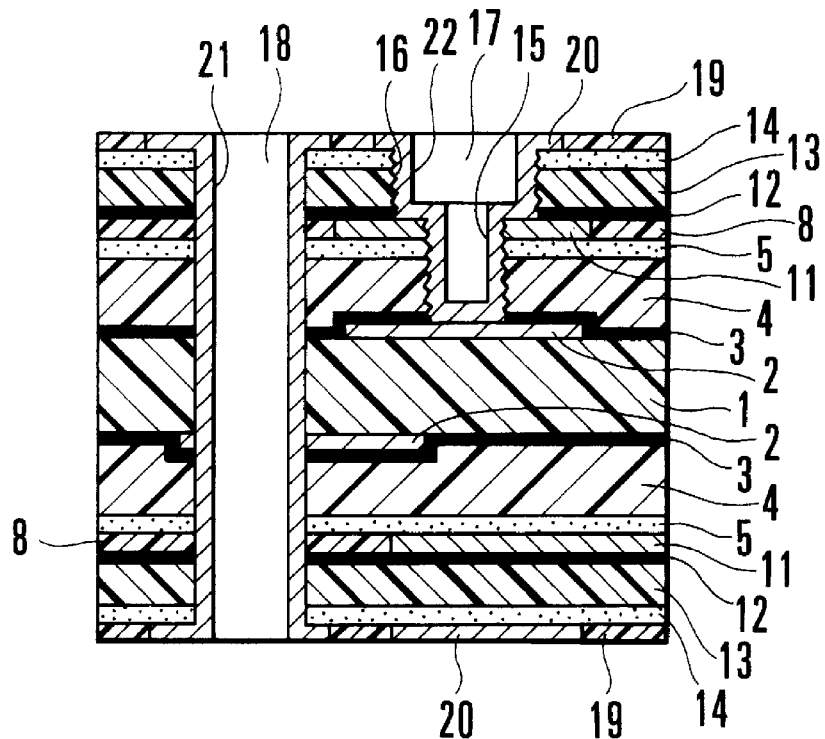
FIG. 3 is a sectional view showing a multilayer printed wiring board according to another embodiment of the present invention.
Figure 4:
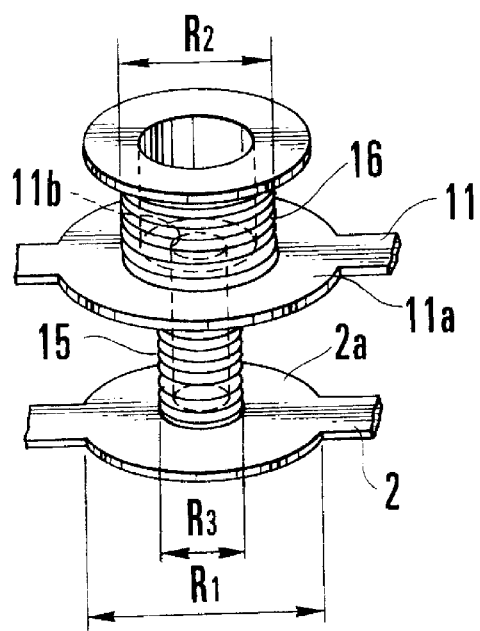
FIG. 4 is a perspective view showing the main part of the multilayer printed wiring board in FIG. 3.

FIGS. 3 and 4 show another embodiment of the present invention. Referring to FIG. 3, reference numeral 1 denotes a glass epoxy copper-clad laminate 1 containing a plating catalyst. First of all, first internal wiring circuits 2 are formed on the upper and lower surfaces of the copper-clad laminate 1 by etching. A land portion 2a having a diameter $R_1$ is formed on the upper internal wiring circuit 2 of the first internal wiring circuits 2, as shown in FIG. 4.

After a roughening process is performed for the first internal wiring circuits 2, insulating resin layers 4, each consisting of an insulating resin and a filler, are stacked on the upper and lower surfaces of the copper-clad laminate 1 through primer layers 3. Adhesive layers 5 are formed on the surfaces of the insulating resin layers 4.

After a desmear process and a seeder process are performed for 18 minutes by using 950 g/l of anhydrous chromic acid of 38° C., plating resist layers 8 are formed on the adhesive layers 5. The resultant structure is then roughened for five minutes by using a roughening solution of 36° C. which consists of three components, i.e., 10 g/l of NaF, 15 g/l of $CrO_3$, and 400 ml/l of $H_2SO_4$. Second internal wiring circuits 11 are then formed on the resultant structure by electroless plating. As shown in FIG. 4, a land portion 11a having the same diameter as the diameter $R_1$ of the land portion 2a is formed on the upper internal wiring circuit 11 of the second internal wiring circuits 11. A hole 11b having a diameter $R_3$ smaller than the diameter of a hole forming laser beam (to be described later) is formed in the center of the land portion 11a.

After a roughening process is performed for the second internal wiring circuits 11, primer layers 12, insulating resin layers 13, and adhesive layers 14 are stacked on the resultant structure.

Subsequently, a short-pulse $CO_2$ laser beam having a beam diameter $R_2$ which can cut an insulating resin layer within a short period of time at high energy without carbonizing it is irradiated toward the land portion 11a of the second internal wiring circuit 11 and the land portion 2a of the first internal wiring circuit 2 from above the upper insulating resin layer 13.

In this case, the diameter $R_2$ of the laser beam, the diameter $R_1$ of the land portions 2a and 11a, and the diameter $R_3$ of the hole 11b of the land portion 11a are set to $R_1 > R_2 > R_3$.

Since the irradiated short-pulse $CO_2$ laser beam does not pass through the land portion 2a of the first internal wiring circuit 2, and the land portion 11a of the second internal wiring circuit 11, a connection blind hole 15 having the diameter $R_2$ is formed in the upper insulating resin layer 13. At the same time, a connection through hole 16 having the same diameter as the diameter $R_3$ of the hole 11b is formed in the insulating resin layer 4 by the short-pulse $CO_2$ laser beam which has passed through the small-diameter hole 11b.

After a stepped blind hole 17 constituted by the connection blind holes 15 and 16 is formed in this manner, a through hole 18 is formed by using a drill.

Finally, a desmear process and a seeder process are performed, plating resist layers 19 are formed on the resultant structure, and external wiring circuits 20 and conductive connecting portions 21 and 22 for the connection through hole and the connection blind hole are formed by electroless plating, thereby forming a through hole plating.

According to the above multilayer printed wiring board of the present invention, since the blind hole 17 is constituted by the large-diameter connection through hole 16 and the small-diameter connection blind hole 15, electric connection between the conductive connecting portion 22 of the blind hole 17 and the land portion 11a is ensured by not only the wall surface of the hole 11b but also the surface of the periphery of the hole 11b. With this structure, the electric contact area between the conductive connecting portion 22 and the land portion 11a can be increased, and hence a conduction failure can be prevented.

Table 2 shows the comparison result obtained by exerting thermal shocks to the connection blind hole in the present invention, which is shown in FIG. 3, and a connection blind hole having no stepped portion in the prior art.

As is apparent from this table, the connection blind hole in the present invention is more reliable than the connection blind hole in the prior art.

Table 2 is formed, complying with JIS-C-5012 9.3. More specifically, a sample was dipped first in an oil bath of 260° C. for five seconds, and then dipped in a cool water bath for five seconds. This process was regarded as one cycle, and was performed until the resistance of the connection blind hole exceeded the initial resistance by 10%.

Each evaluation pattern for a multilayer printed wiring board includes 200 connection blind holes each having a diameter of 0.2 mm.

TABLE 2

| Item n: Number of Samples | Test Result |
| --- | --- |
| Present Invention (n = 100) | 200 cycles OK |
| Prior Art (n = 100) | 80 cycles NG |

In addition to the above effects, by using a short-pulse $CO_2$ laser beam, a plurality of ring-like projections can be formed on the wall surface of the blind hole 17 in the vertical direction. For this reason, the adhesion properties between the wall surface of the blind hole 17 and the conductive connecting portion 22 improve to prevent a conduction failure caused when they peel off upon exertion of an external shock. The reliability of this structure therefore improves.

According to this embodiment, the multilayer printed wiring board has a three-layer structure constituted by the first and second internal wiring circuits 2 and 11 and the external wiring circuit 20. As is apparent, however, the present invention can be applied to a multilayer printed wiring board constituted by four or more layers, including two or more second internal wiring circuits 11.

In addition, the land portions 2a and 11a have circular shapes. However, the land portions need not be circular. For example, even if these portions are formed into wide belt-like wiring layers, the same effects as those described above can be obtained. That is, the shapes of the land portions 2a and 11a can be variously designed.

FIGS. 5A to 5D and 6 show still another embodiment of the present invention. The same reference numerals in FIGS. 5A and 5B denote the same parts as in FIGS. 1A and 2B, and a detailed description thereof will be omitted.

As materials for a primer layer 3, an insulating resin layer 4, and an adhesive layer 5 formed on a copper-clad laminate 1, materials which are cut by a laser beam at 30 to 70 $\mu$m/shot, 50 to 90 $\mu$m/shot, and 80 to 120 $\mu$m/shot are respectively selected.

Figure 5A:
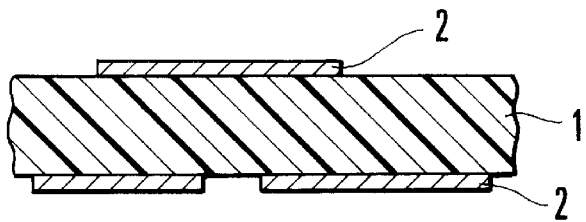
FIGS. 5A to 5D are sectional views for explaining the steps in a method of manufacturing a multilayer printed wiring board according to still another embodiment of the present invention.
Figure 5B:
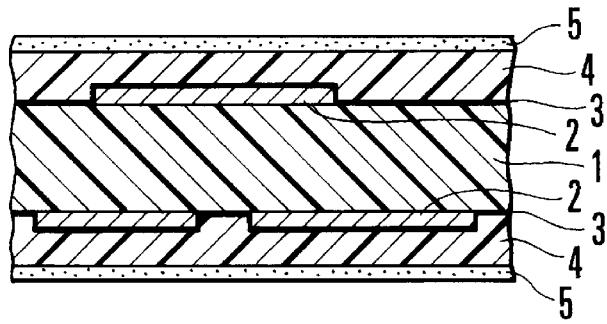
Figure 5C:
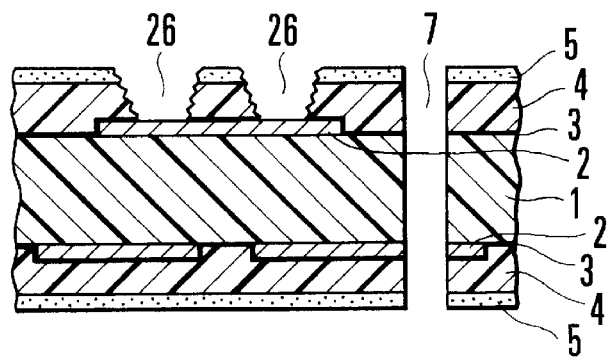

As shown in FIG. 5C, a short-pulse $CO_2$ laser with an oscillation frequency of $10^4$ to $10^8$ Hz is used to irradiate a laser beam onto the adhesive layer 5 to form a blind hole 26 in the adhesive layer 5, the insulating resin layer 4, and the primer layer 3. Thereafter, a through hole 7 is formed by using a drill.

Owing to the above laser cut rates with respect to the primer layer 3, the insulating resin layer 4, and the adhesive layer 5, the blind hole 26 is formed by the laser beam such that the cut amount gradually decreases in the following order: the adhesive layer 5, the insulating resin layer 4, and the primer layer 3.

In other words, the diameter of the hole gradually decreases in the following order: the holes formed in the adhesive layer 5, the insulating resin layer 4, and the primer layer 3.

Figure 6:
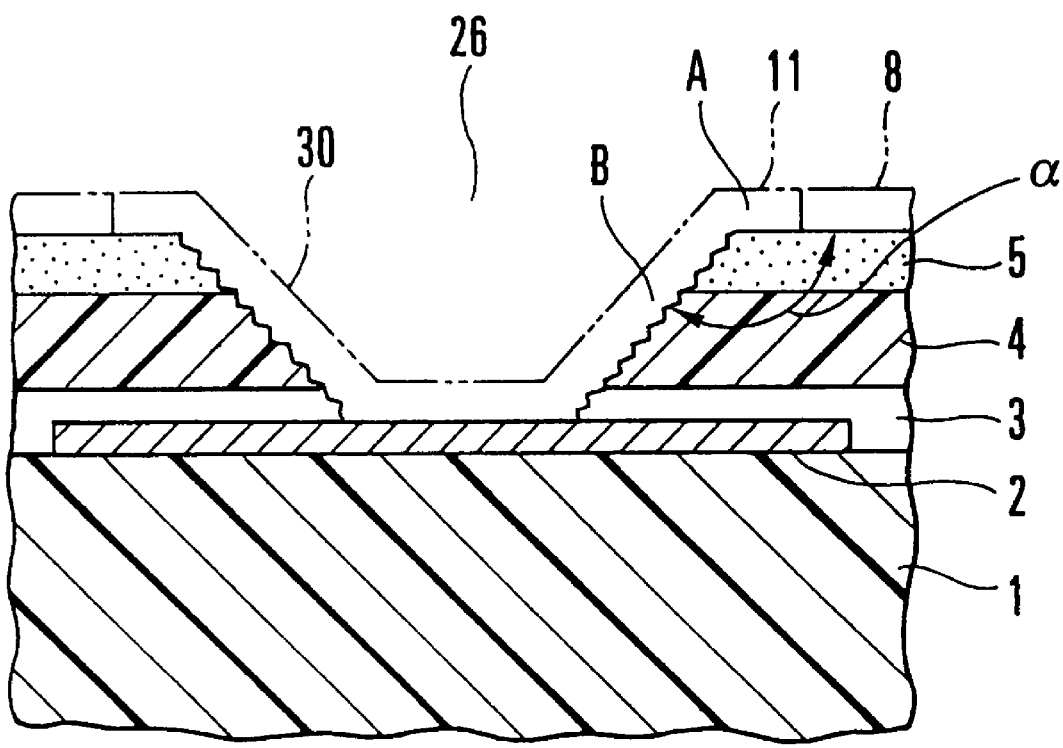
FIG. 6 is a sectional view showing the main part of the multilayer printed wiring board in FIGS. 5A to 5D.

As shown in FIG. 6, therefore, the blind hole 26 has a conical cross-section. In this embodiment, an angle $\alpha$ defined by an upper edge A and a wall surface B is set to an obtuse angle of 120°.

Figure 5D:
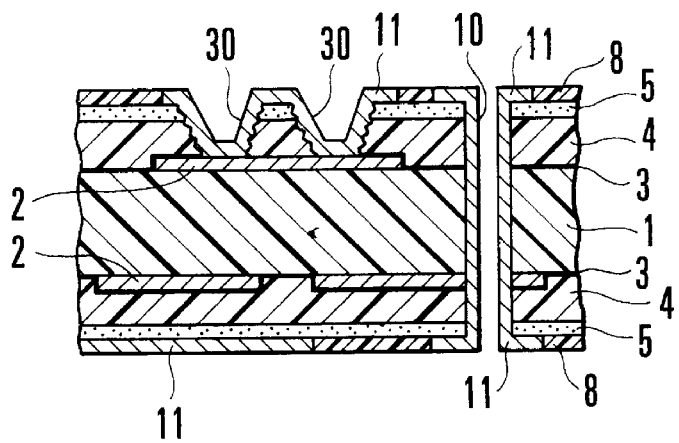

As shown in FIG. 5D, after a desmear process is performed for 18 minutes by using 950 g/l of anhydrous chromic acid of 38° C., plating resist layers 8 consisting of epoxy resin are applied to the adhesive layers 5 or photosensitive dry film resist layers are laminated thereon. The resultant structure is roughened for five minutes by using a roughening solution of 36° C. which is constituted by 10 g/l of NaF, 15 g/l of $CrO_3$, and 400 ml/l of $H_2SO_4$. Thereafter, external wiring circuits 11 are formed by electroless copper plating, and copper platings are precipitated on the wall surfaces of the blind hole 26 and the through hole 7 to form a connection blind hole 30 and a connection through hole 10.

Table 3 is formed by a comparison between the measured reliability of the connection blind hole 30 of the multilayer printed wiring board of this embodiment and that of a connection blind hole formed in a conventional multilayer printed wiring board which is formed by using a drill such that the angle defined by the upper edge and wall surface of the blind hole is set to 90°.

As is apparent from this table, the connection blind hole 30 of the multilayer printed wiring board of the present invention is apparently higher in electrical connection reliability than the connection blind hole in the prior art.

TABLE 3

|  | Angle Defined by Upper Edge A and Wall Surface B | Initial Value *1 | On Resistance After Thermal Shock Process *2 |
| --- | --- | --- | --- |
| Present Invention | 120° | 2.4 m$\Omega$ | 2.5 m$\Omega$ (+4%) |
| Prior Art | 90° | 2.4 m$\Omega$ | 3.4 m$\Omega$ (+42%) |

*1: double-sided printed board composite test pattern based on JIS C5012 (A multilayer plate is formed by stacking two boards on each other and forming internal and external wiring circuits on the respective boards under the following conditions: line width = 0.1 mm, land diameter = 2 mm, through hole diameter = 0.1 mm, distance between first and second layers = 80 $\mu$m, and plating thickness = 30 $\mu$m.)
*2: 2,000 cycles of thermal shock (high-temperature dipping) test based on JIS C5012 (On resistances are measured after the process. When the change ratio of the measured resistance to the initial resistance is +10% or less, the corresponding sample is determined as nondefective according to the standard based on JIS C5014.)

According to this embodiment, the angle $\alpha$ defined by the upper edge and wall surface of the blind hole 26 can be set to an obtuse angle while the electrical connection reliability between the internal wiring circuit 2 and the connection blind hole 30 is maintained. The multilayer printed wiring board repeatedly expands/contracts owing to the heat generated when a product on which the multilayer printed wiring board is mounted is used, and the stress generated by expansion/contraction acts on the connection blind hole 30. However, since the angle a is set to an obtuse angle, the concentration of the stress between the upper edge and wall surface of the blind hole 26 is reduced as compared with the prior art in which the angle $\alpha$ is set to 90°, thereby preventing damage to the upper edge of the connection blind hole 30. Therefore, the electrical connection reliability between the external wiring circuit 11 and the connection blind hole 30 can be improved. The angle a can be properly changed by changing the laser cut rates with respect to a plurality of insulating resin layers formed between the internal wiring circuit 2 and the external wiring circuit 11 and the thicknesses of the resin layers.

Since a short-pulse $CO_2$ laser beam is used, a plurality of ring-like projections can be formed on the wall surface of the blind hole 26 in the vertical direction, an improvement in the adhesion properties between the wall surface of the blind hole 26 and the conductive connecting portion can be attained, as well as the above effects. This prevents a conduction failure caused when the conductive connecting portion peels off upon exertion of an external shock. Consequently, an improvement in reliability can be attained.

FIGS. 7 and 8A to 8C show still another embodiment of the present invention. Referring to FIGS. 7 and 8A to 8C, reference numeral 51 denotes a multilayer printed wiring board of this embodiment. The multilayer printed wiring board 51 has a four-layer structure in which internal wiring circuits 45 and external wiring circuits 48 formed on the upper and lower surface sides of an internal layer wiring plate 41 are connected to each other through a connection through hole 47 and a connection blind hole 52. The internal layer wiring plate 41 is obtained by forming the internal wiring circuits 45 on the upper and lower surfaces of a glass epoxy copper-clad laminate 1 containing a plating catalyst. Note that the internal layer wiring plate 41 may be formed by using a full additive method of forming conductive layers serving as the internal wiring circuit 45 on the upper and lower surfaces of an insulating board such as an insulating resin film containing a plating catalyst by electroless copper plating.

Insulating layers 42 are formed by bonding insulating resin films containing a plating catalyst on the upper and lower surfaces of the internal layer wiring plate 41.

The connection blind hole 52 is constituted by a blind hole 53 formed by a laser beam and a conductor 54 precipitated on the wall surface of the blind hole 53 by electroless copper plating. The blind hole 53 is formed to have a diameter larger than that of a surface of a connection blind hole land 45b which is located on the external wiring circuit 48 side, i.e., to extend to a portion adjacent to the connection blind hole land 45b of the insulating layer 42 and also extend from the surface to an internal wiring circuit insulating board 44. In this embodiment, the bottom of the blind hole 53 is formed inside the internal wiring circuit insulating board 44.

When the blind hole 53 is formed in this manner, the surface and vertical wall surface of the connection blind hole land 45b are exposed inside the blind hole 53. That is, the area of the surface of the connection blind hole land 45b is smaller than that of a land in the prior art in which a hole is formed by using a drill, provided that the diameter of the blind hole 53 is equal to that of the hole formed with the drill.

Figure 7:
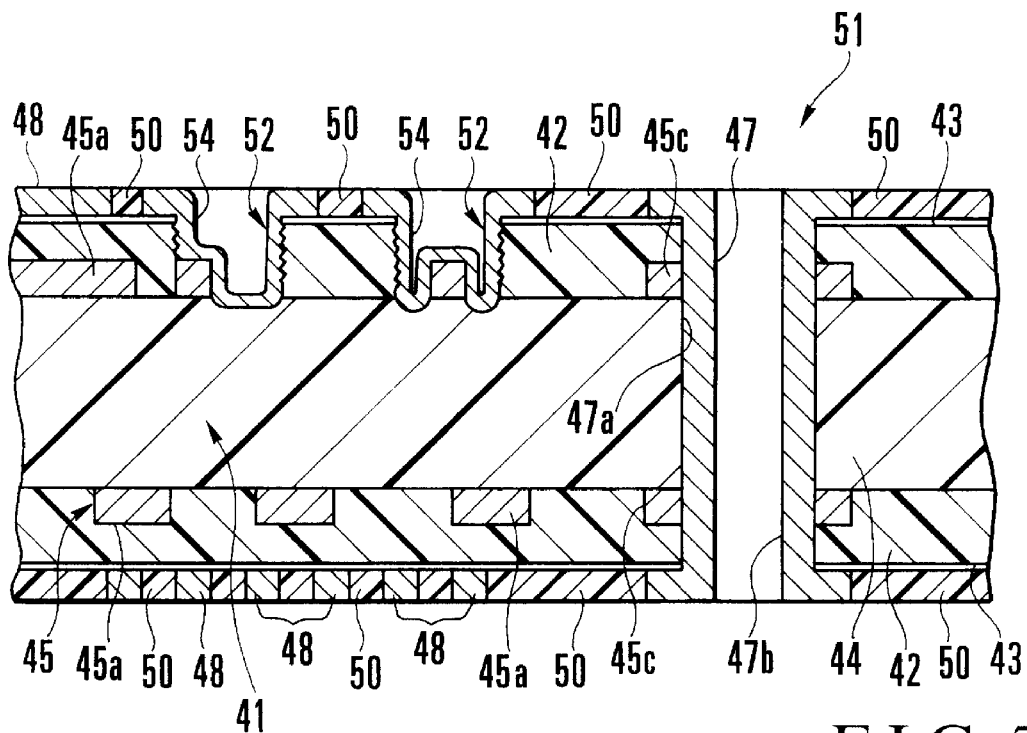
FIG. 7 is a sectional view showing a multilayer printed wiring board according to still another embodiment of the present invention.

As shown in FIG. 7, of the two connection blind holes 52, the connection blind hole 52 on the right side is formed at an accurate position without causing an offset between the blind hole 53 and the connection blind hole land 45b. In this state, the conductor 54 is formed on the entire surface of the connection blind hole 52 except for the entire surface of the connection blind hole land 45b and a connection portion of the vertical wall of the connection blind hole land 45b which is connected to a wiring pattern 45a. The connection blind hole 52 on the left side is formed such that the blind hole 53 is slightly offset from the connection blind hole land 45b due to a manufacturing error or the like. The entire surface of the land 45b connected to the connection blind hole 52 on the left side is exposed within the blind hole 53, while a portion of the vertical wall of the land 45b is exposed within the blind hole 53. The conductor 54 is formed on the entire exposed surfaces.

Figure 8A:
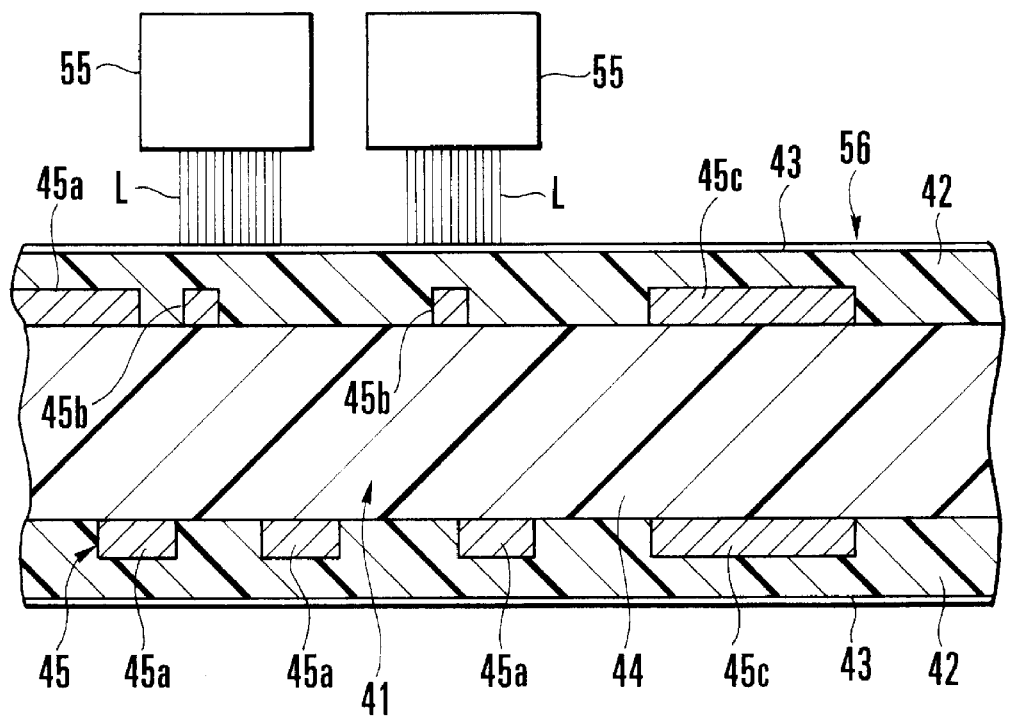
FIGS. 8A to 8C are sectional views for explaining the steps in a method of manufacturing the multilayer printed wiring board in FIG. 7.

Referring to FIG. 8A, reference numeral 55 denotes a laser beam irradiating unit. The laser beam irradiating unit 55 is designed to irradiate a short-pulse $CO_2$ laser beam L onto a predetermined position on a board 56 obtained by forming the insulating layers 42 and the adhesives 43 on the internal layer wiring plate 41. The predetermined position is a position corresponding to the connection blind hole land 45b of the internal wiring circuit 45. The irradiation range of the short-pulse $CO_2$ laser beam L is set to be wider than the surface of the land 45b.

A method of manufacturing the multilayer printed wiring board 51 having the above arrangement will be described next. First of all, the board 56 in FIG. 8A is manufactured. This board 56 is formed as follows. Insulating resin films, each containing a plating catalyst, are bonded to the upper and lower surfaces of the internal layer wiring plate 41 to form the insulating layers 42. In addition, an adhesive layer 43 is formed on the outer surface of each insulating layer 42.

Subsequently, the laser beam irradiating unit 55 is used to irradiate the short-pulse $CO_2$ laser beam L with a predetermined output onto a portion of the surface of the board 56 which corresponds to the connection blind hole land 45b for a predetermined period of time. The irradiation conditions (output and time) in this case are set to values that allow the blind hole 53 to be also formed in the internal wiring circuit insulating board 44. These irradiation conditions are set to the optimal output and time obtained by experiment. Note that the single laser beam irradiating unit 55 may be designed to be movable in a direction parallel to the surface of the board 56 so as to form all the blind holes 53.

Figure 8B:
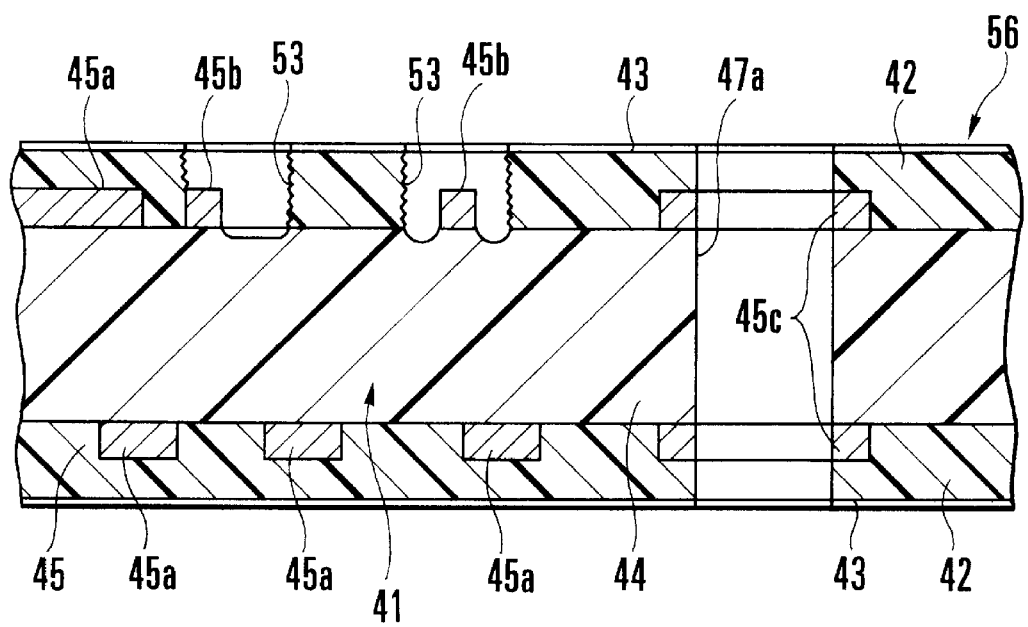
Figure 8C:
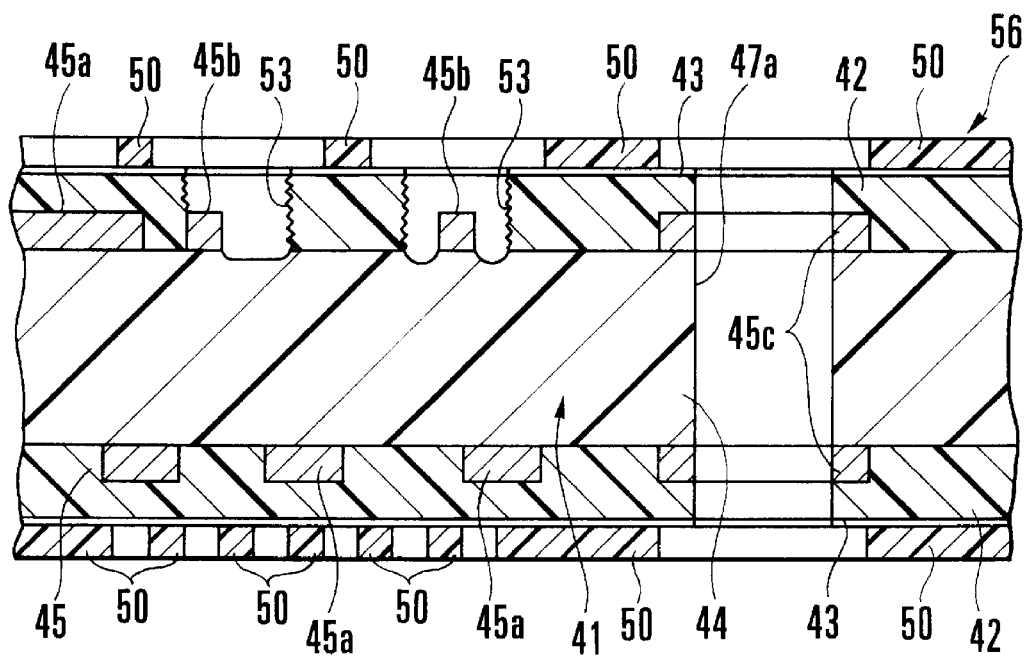
Figure 9A:
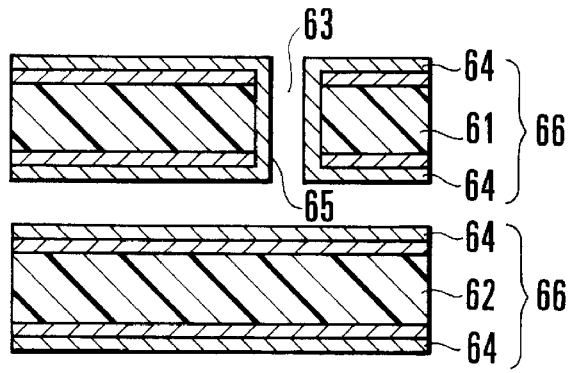
FIGS. 9A to 9D are sectional views for explaining the steps in a conventional method of manufacturing a multilayer printed wiring board.
Figure 9B:
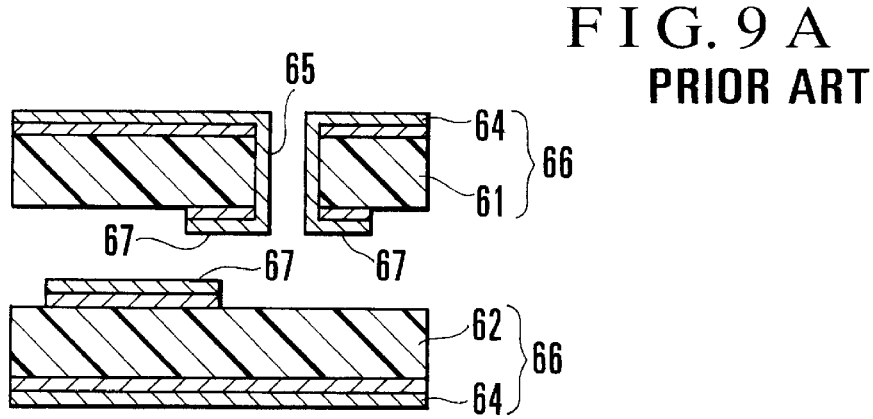
Figure 9C:
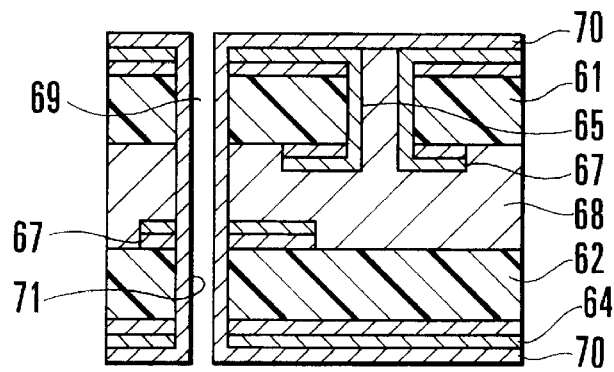
Figure 9D:
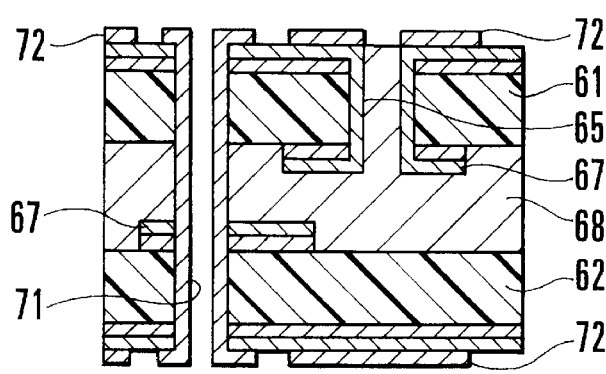

When the laser beam is irradiated in this manner, the blind hole 53 is formed to extend from the adhesive layer 43, which is the outermost layer, to the internal wiring circuit insulating board 44, as shown in FIG. 8B. In this case, since the short-pulse $CO_2$ laser beam L is reflected by the land 45b, the land 45b is left in the blind hole 53. As a result, the surface and vertical wall of the land 45b are exposed. In addition, the wall surface of the blind hole 53 formed by the short-pulse $CO_2$ laser beam L is roughened. Thereafter, a through hole 47a is formed by using a drill (not shown), and a desmear process is performed for the wall surface of the through hole 47a. As shown in FIG. 8C, electroless copper plating resist layers 50 are formed on the upper and lower surfaces of the board 56.

In this embodiment, as the resist layer 50, a photosensitive dry film resist is used. The resist layers 50 are formed such that when they are exposed and developed, portions corresponding to the through hole 47, the external wiring circuits 48, and the connection blind holes 52 are exposed. After the resists 50 are formed in this manner, the board 56 is dipped in an electroless copper plating bath to be subjected to electroless copper plating.

In the electroless copper plating step, conductors consisting of copper are precipitated on the exposed portions of the board 56. As a result, as shown in FIG. 7, the through hole 47, the external wiring circuits 48, and the connection blind holes 52 are formed. In this case, since the conductor 54 of the connection blind hole 52 extends from the surface of the connection blind hole land 45b to the vertical wall to come into contact therewith, the area of the conductive portion between the land 45b and the conductor 54 becomes large even if the land 45b is small.

Assume that in the hole forming step using a laser beam, the position of the laser beam irradiating unit 55 is offset from the board 56, or the connection blind hole land 45b of the internal wiring circuit 45 is offset from a design position in manufacturing the board 56. Even in this case, as indicated by the connection blind hole 52 on the left side, as shown in FIG. 7, a portion of the vertical wall of the land 45b is exposed with the blind hole 53, and the conductor 54 is brought into contact with this exposed surface, thereby preventing a connection failure.

In addition, since a plurality of ring-like projections are formed on the wall surface of the blind hole 53 in the vertical direction in the hole forming step using the short-pulse $CO_2$ laser beam L, the conductor 54 precipitated on the wall surface firmly adheres thereto.

As the short-pulse $CO_2$ laser beam L, a laser beam emitted from a laser having an oscillation wavelength of 10.6 $\mu$m was used to form the wall surface of the blind hole 53 into a roughened surface which allowed the conductor 54 to firmly adhere thereto.

When this oscillation wavelength fell within the range of 8 to 30 $\mu$m, the adhesion strength of the conductor 54 could be increased. When the oscillation wavelength was set to 10.6 $\mu$m, as described above, a plurality of ring-like projections were formed on the wall surface at intervals of about 5.3 $\mu$m in the vertical direction.

When a thermal shock test was conducted on the multilayer printed wiring board 51 in FIG. 7 and a conventional multilayer printed wiring board, a desirable result was obtained, as indicated in Table 4 below. This thermal shock test was based on the U.S. military standard "MIL-STD-202E, 107D". When the resistance of a connection blind hole exceeded the initial resistance by 10% after 1,000 cycles of the thermal shock test, the corresponding sample was determined as an NG sample. The criterion in this thermal shock test was based on the quality standard "MIL-P-55110C". The thermal shock test was conducted on 50 multilayer printed wiring boards each identical to the multilayer printed wiring board 51 of the present invention and on 50 conventional multilayer printed wiring boards in the same manner. Note that 200 connection blind holes, each having a diameter of 0.2 mm, were formed in each multilayer printed wiring board.

TABLE 4

| | Number of NG samples Whose Resistances Exceeded Initial Resistance of Connection Blind Holes by 10% |
|---|---|
| Process Condition | 1,000 cycle |
| Present Invention | 0/50 |
| Prior Art | 5/50 |

As is apparent from Table 4, the multilayer printed wiring board manufactured by the manufacturing method of the present invention is higher in connection reliability of connection blind holes than the conventional multilayer printed wiring board.

According to this embodiment, since the conductor 54 is formed on the surface and vertical wall of the internal wiring circuit conductor 45b by plating, the conductor 54 can be brought into contact with a large area of the internal wiring circuit conductor 45b.

As compared with the case wherein the blind hole 53 is formed with the drill, therefore, the internal wiring circuit conductor 45b can be formed to have a small size, provided that the area of the conductive portion between the connection blind hole land 45b and the conductor 54 remains the same. For this reason, the density of internal wiring circuits can be increased without degrading the connection reliability of the connection blind holes 52.

In addition, the irradiation range of a laser beam is set to be wider than the surface of the connection blind hole land 45b, and the blind hole 53 is caused to extend from the surface of the connection blind hole land 45b to the internal wiring circuit insulating board 44. Since the laser beam is reflected by the connection blind hole land 45b, the connection blind hole land 45b is left in the blind hole 53. As a result, the surface and vertical wall of the internal wiring circuit 45 are exposed.

In the plating step, therefore, a conductor is formed to extend from the surface of the connection blind hole land 45b to its vertical wall. As a result, a conductive portion having a large area can be ensured between the conductor 54 formed by plating and the connection blind hole land 45b. For this reason, the connection blind hole 52 having a large-area conductive portion and high connection reliability can be formed by only controlling a laser beam, allowing a reduction in manufacturing cost as compared with the case wherein a blind hole is formed by using a drill.

Since a short-pulse $CO_2$ laser beam is used, a plurality of ring-like projections can be formed on the wall surface of the blind hole 53 in the vertical direction, an improvement in the adhesion properties between the wall surface of the blind hole 53 and the conductive connecting portion can be attained, as well as the above effects. This prevents a conduction failure caused when the conductive connecting portion peels off upon exertion of an external shock. Consequently, an improvement in reliability can be attained.

What is claimed is:

1. A method of manufacturing a multilayer printed wiring board including an internal wiring circuit formed on a board, an insulating resin layer formed on the internal wiring circuit, a blind hole formed in the insulating resin layer and communicating with the internal wiring circuit, and a conductive portion formed on an inner wall of the blind hole and connected to the internal wiring circuit, the method comprising the steps of:

forming the blind hole by using a short-pulse $CO_2$ laser;

preparing at least two internal wiring circuits which are isolated from each other by an insulating layer in a direction of thickness;

forming one land portion, which has a hole formed in correspondence with the blind hole, on one of the two internal wiring circuits which is on an upper surface side;

forming the other land portion on the other internal wiring circuit on a lower surface side in correspondence with a bottom portion of the blind hole so as to have a diameter larger than that of the hole of said one land portion;

forming the blind hole by using a laser beam from a short-pulse $CO_2$ laser which has a diameter smaller than the diameters of the two land portions and larger than the diameter of the hole of said one land portion; and, performing through hole plating.

2. A method according to claim 1, wherein an oscillation frequency of the short-pulse $CO_2$ laser is set to $10^4$ to $10^4$ Hz.

3. A method according to claim 1, further comprising forming an external wiring circuit on the insulating resin layer, the external wiring circuit being connected to the conductive portion of the blind hole.

4. A method according to claim 1, further comprising forming the insulating resin layer by using epoxy resin containing no glass cloth.

5. A method according to claim 4, wherein the insulating resin layer contains a plating catalyst.

6. A method according to claim 3, further comprising forming the insulating resin layer by using a plurality of layers, and arranging a layer of the plurality of layers cut by a laser beam on the external wiring circuit side, and a layer of the plurality of layers cut by a laser beam on the internal wiring circuit side.

7. A method according to claim 6, further comprising forming the insulating resin layer by using a first layer cut by a laser beam at 120 to 80 $\mu$m/shot, a second layer cut by a laser beam at 90 to 50 $\mu$m/shot, and a third layer cut by a laser beam at 70 to 30 $\mu$m/shot, the first to third layers being arranged from the external wiring circuit side to the internal wiring circuit side, and using a short-pulse $CO_2$ laser having an oscillation frequency of $10^4$ to $10^8$ Hz to irradiate a laser beam from the first layer side, thereby forming a blind hole such that an angle defined by an upper edge and wall surface of the blind hole is set to not less than 90°.

8. A method according to claim 1, wherein an irradiation range of the short-pulse $CO_2$ laser is expanded to a portion adjacent to the internal wiring circuit on the insulating resin layer.

* * * * *